(12) United States Patent
Endo et al.

(10) Patent No.: US 8,778,150 B2
(45) Date of Patent: Jul. 15, 2014

(54) MAGNETRON SPUTTERING CATHODE, MAGNETRON SPUTTERING APPARATUS, AND METHOD OF MANUFACTURING MAGNETIC DEVICE

(75) Inventors: Tetsuya Endo, Tokyo (JP); Einstein Noel Abarra, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 386 days.

(21) Appl. No.: 12/701,922

(22) Filed: Feb. 8, 2010

(65) Prior Publication Data

US 2010/0213048 A1   Aug. 26, 2010

(30) Foreign Application Priority Data

Feb. 26, 2009 (JP) .................................. 2009-043376
Dec. 4, 2009 (JP) .................................. 2009-276689

(51) Int. Cl.
*C23C 14/34* (2006.01)

(52) U.S. Cl.
USPC ............. 204/298.12; 204/298.16; 204/298.19

(58) Field of Classification Search
USPC ............................ 204/298.12, 298.19, 298.16
See application file for complete search history.

(56) References Cited

U.S. PATENT DOCUMENTS

| | | | | | |
|---|---|---|---|---|---|
| 5,827,414 | A | * | 10/1998 | Westwood ................ | 204/298.12 |
| 6,068,742 | A | * | 5/2000 | Daxinger et al. ......... | 204/298.09 |
| 2003/0075437 | A1 | * | 4/2003 | Marx et al. ............... | 204/298.12 |
| 2005/0034980 | A1 | | 2/2005 | Monaghan et al. ...... | 204/298.18 |
| 2009/0045051 | A1 | * | 2/2009 | Ferrasse et al. .......... | 204/298.13 |

FOREIGN PATENT DOCUMENTS

| | | |
|---|---|---|
| JP | 60-039158 A | 2/1985 |
| JP | 60-089571 A | 5/1985 |
| JP | 62-064768 U | 4/1987 |
| JP | 05-009722 A | 1/1993 |
| JP | 08-325718 A | 12/1996 |
| JP | 2003-226965 A | 8/2003 |
| JP | 2005-509091 | 4/2005 |
| JP | 2008-025001 A | 2/2008 |

OTHER PUBLICATIONS

Office Action in Japanese Application No. 2009-276689, mailed Oct. 1, 2013, with English translation (6 pages).

* cited by examiner

*Primary Examiner* — Keith Hendricks
*Assistant Examiner* — Jason M Berman
(74) *Attorney, Agent, or Firm* — Fitzpatrick, Cella, Harper & Scinto

(57) ABSTRACT

To provide a magnetron sputtering cathode, a magnetron sputtering apparatus, and a method of manufacturing a magnetic device, capable of generating a leakage magnetic field sufficiently large to form a magnetic tunnel necessary for discharge on the surface of a target even when the target is a magnetic body and thick and a ferromagnetic body is used as the target. The magnetron sputtering cathode of the present invention includes a target having a second annular groove provided on the sputtering surface of the target, a third annular projection provided on the non-sputtering surface of the target, a fourth annular groove provided outside the third annular projection on the non-sputtering surface, and a fourth annular projection provided outside the fourth annular groove on the non-sputtering surface. Further, the magnetron sputtering cathode includes a first magnet and a second magnet 6 having a polarity different from that of the first magnet on the non-sputtering surface side.

15 Claims, 13 Drawing Sheets

MAGNETRON SPUTTERING CATHODE, MAGNETRON SPUTTERING APPARATUS, AND METHOD OF MANUFACTURING MAGNETIC DEVICE

CROSS-REFERENCES TO RELATED APPLICATIONS

This application claims the benefit of priority from Japanese Patent Application Nos. 2009-043376 filed on Feb. 26, 2009 and 2009-276689 filed on Dec. 4, 2009, the entire contents of which is incorporated herein by reference.

BACKGROUND OF THE INVENTION

1. Field of the Invention

The present invention relates to a magnetron sputtering cathode, a magnetron sputtering apparatus, and a method of manufacturing a magnetic device.

2. Description of the Related Art

Sputtering processes using ferromagnetic materials are routinely utilized for manufacturing magnetic heads, such as GMR and TMR heads, MRAM devices, and inductors.

In a manufacturing process in a vacuum, such as a sputtering process, it has conventionally been regarded as important to improve the operating rate and to reduce the manufacturing cost by reducing the maintenance time required for the exchange of targets as much as possible. Because of this reason, a method has been searched for, which lengthens the target lifetime by increasing the thickness of the sputtering target itself and increases the operating rate.

In magnetron sputtering, a cathode magnet is provided behind a sputtering target so that a closed circuit magnetic field "tunnel" is formed on the discharge surface of the sputtering target.

In the above-mentioned sputtering process, in particular, in the process for manufacturing a magnetic head, a sputtering target made of a ferromagnetic material, such as an alloy of iron and cobalt and an alloy of nickel and iron, is used. Since these ferromagnetic targets have very high magnetic permeability and saturation magnetic flux density, even if a cathode magnet is installed behind a sputtering target made of a ferromagnetic material, almost all of the magnetic lines of force pass through the inside of the ferromagnetic target, and therefore, no magnetic tunnel is formed on the target discharge surface and a sufficient magnetic field strength cannot be obtained.

In order to solve the above-mentioned problem, a conventional sputtering cathode has employed a method of optimizing the shape of a target so that magnetic lines of force can be generated efficiently from a cathode magnet placed behind the target to the front of the target.

Japanese Publication of Patent Application No. 2005-509091 has proposed a method of confining a magnetic field between auxiliary targets by dividing a target into a plurality of regions of the auxiliary targets and a main target and making the height of the auxiliary target greater than that of the main target.

However, as a result of a simulation conducted to evaluate the magnetic field on a target surface by applying the method according to Japanese Publication of Patent Application No. 2005-509091 to a target of a material having high saturation magnetic flux density, for example, an iron-cobalt alloy (saturation magnetic flux density is 2.4 Tesla), almost all the magnetic lines of force pass through inside of the main target and the magnetic field component parallel to the surface of the main target became very small.

Conventionally, it has been required to increase the thickness of a target in order to improve the tool utilization (operating rate) by lengthening the target lifetime, however, as described above, the magnetic field on the target discharge surface (sputtering surface) becomes smaller with increasing thickness of the target, and the leakage magnetic field will disappear soon. That is, if the thickness of a target is increased, the target lifetime is lengthened, and therefore, the exchange span of the target is also lengthened and the operating rate is improved as a result, however, if the thickness of a target is increased, the magnetic field that leaks out from the target will decrease or disappear. Because of this, there has conventionally been a limit to achieving both the formation of a sufficient magnetic field on the target discharge surface and the lengthening of the target lifetime.

Further, conventionally, it has been difficult to cause a sufficient magnetic field to leak out to the target discharge surface even by using the method described in Japanese Publication of Patent Application No. 2005-509091 when a ferromagnetic body having high magnetic permeability and saturation magnetic flux density is used as a target.

SUMMARY OF THE INVENTION

Therefore, an object of the present invention is to provide a magnetron sputtering cathode, a magnetron sputtering apparatus and a method of manufacturing a magnetic device, capable of generating a magnetic field sufficiently large to form a magnetic tunnel necessary for discharge on the surface of a target even when the target material is a magnetic body and thick, and/or a ferromagnetic body is used as the target.

In order to achieve the above-mentioned object, a first aspect of the present invention is a magnetron sputtering cathode comprising: a target having: a first annular groove provided on a first surface of the target; a first annular projection provided at least at a position facing the first annular groove on a second surface of the target on the opposite side of the first surface; a second annular groove provided at least on one of sides outside and inside the first annular projection on the second surface; and a second annular projection provided at least on one of sides outside and inside the second annular groove on the second surface; a first magnet located inside the first annular groove of the target on the side of the second surface of the target; and a second magnet having a polarity different from that of the first magnet and located outside the first annular groove of the target on the side of the second surface of the target, wherein the first annular groove, the second annular groove, the first annular projection and the second annular projection are located between the first magnet and the second magnet.

A second aspect of the present invention is a target configured to be provided on a cathode including a first magnet and a second magnet disposed so as to surround the first magnet and having a polarity different from that of the first magnet, the target comprising: a first region to face the first magnet; a second region to face the second magnet; a first annular groove provided on a first surface of the target; a first annular projection provided at least at a position facing the first annular groove on a second surface of the target on the opposite side of the first surface; a second annular groove provided at least on one of sides outside and inside the first annular projection on the second surface; and a second annular projection provided at least on one of sides outside and inside the second annular groove on the second surface, wherein the first annular groove, the second annular groove, the first annular projection and the second annular projection are located between the first region and the second region.

A third aspect of the present invention is a magnetron sputtering apparatus comprising: the magnetron sputtering cathode described in the above-mentioned first aspect; an exhaust means; and a gas introduction means for introducing a process gas.

A fourth aspect of the present invention is a method of manufacturing a magnetic device for manufacturing a magnetic device using the magnetron sputtering apparatus described in the above-mentioned third aspect.

By doing so as described above, it is made possible to generate magnetic lines of force in the form of a tunnel radially in an annular groove of a target provided on the side of a plasma space. By means of the magnetic lines of force and an electric field at the bottom of the annular groove, plasma is generated and it is made possible to perform a sputtering process.

According to the present invention, it is possible to provide a magnetron sputtering cathode capable of generating a magnetic filed substantially parallel with the target surface.

DESCRIPTION OF THE EMBODIMENTS

Figure 1:
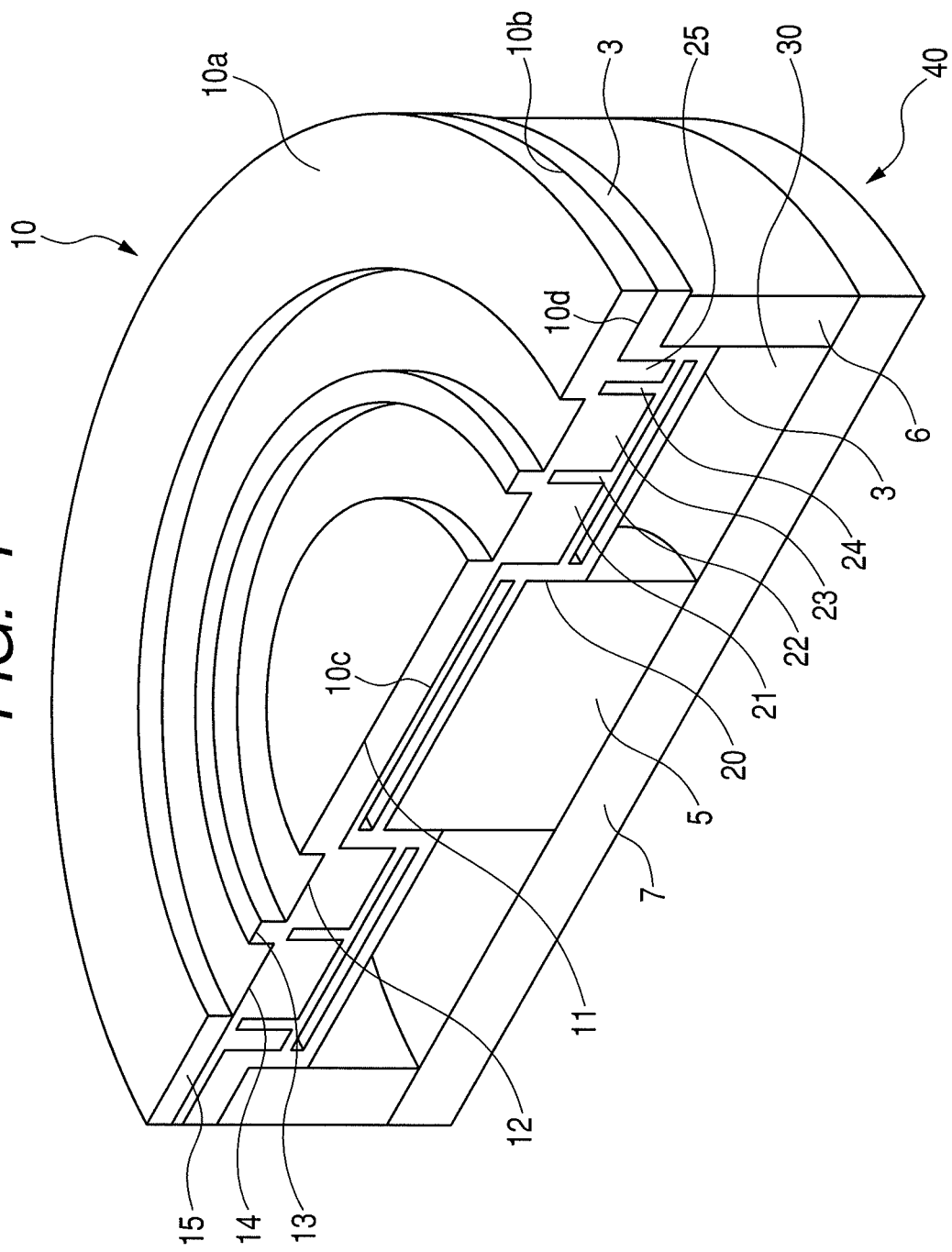
FIG. 1 is a perspective, cross-sectional view showing a structure of a sputtering cathode according to an embodiment of the present invention.
Figure 2:
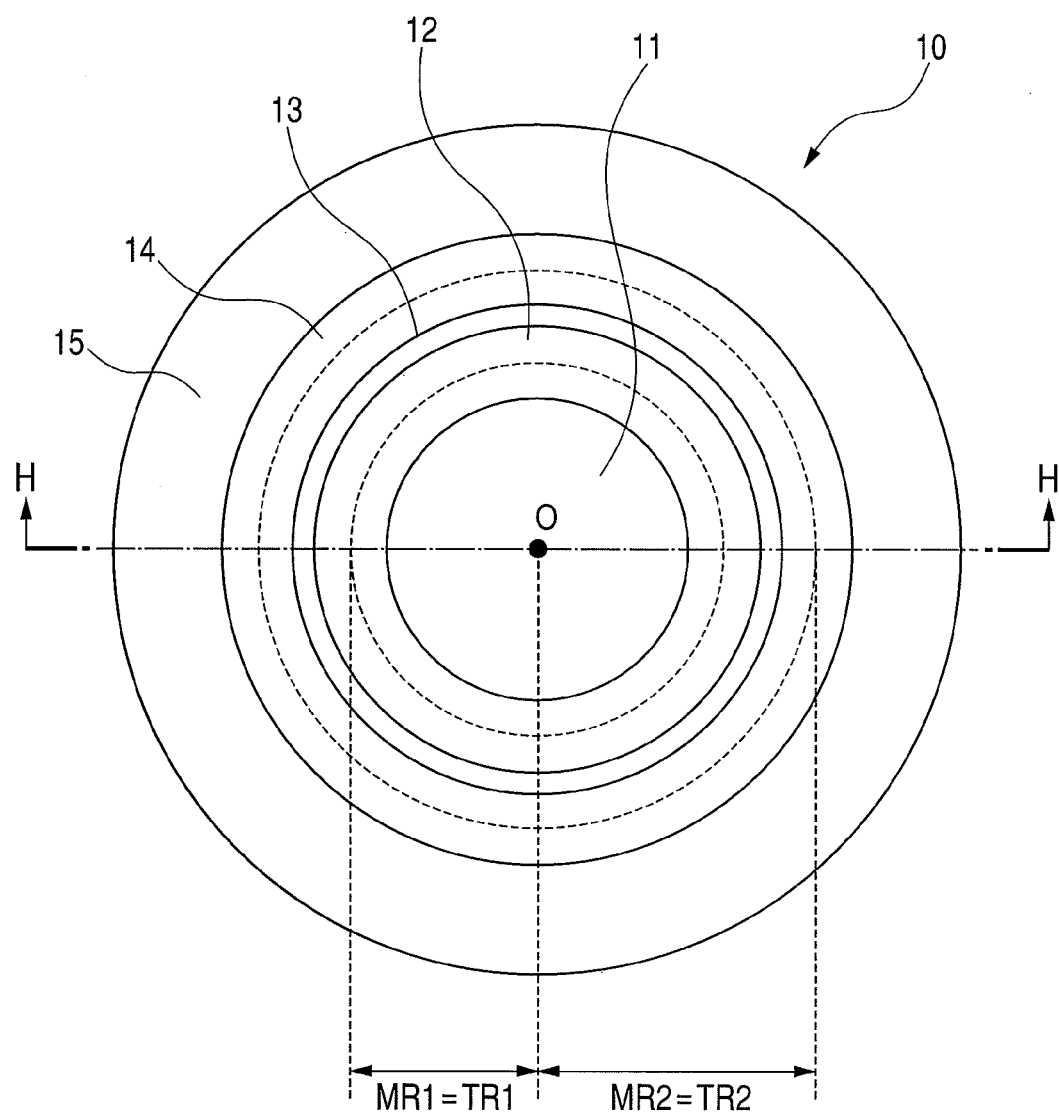
FIG. 2 is a top view of a target according to an embodiment of the present invention.
Figure 3:
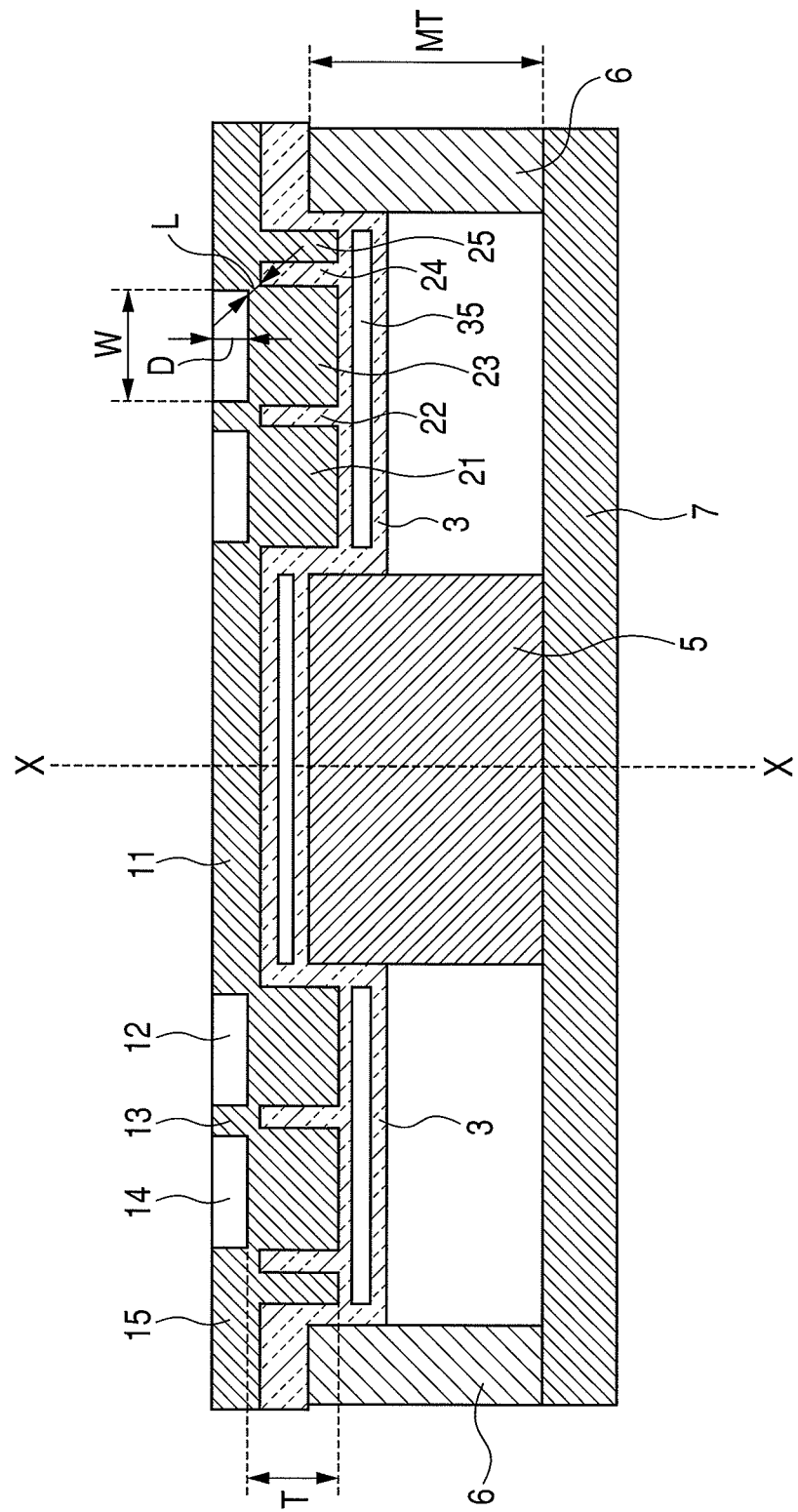
FIG. 3 is a cross-sectional view showing a structure of a sputtering cathode according to an embodiment of the present invention.

Referring to FIG. 1, FIG. 2 and FIG. 3, a structure of a magnetron sputtering cathode that can be applied to the present invention will be described. FIG. 1 is a perspective, cross-sectional view showing a structure of a magnetron sputtering cathode. FIG. 2 is a top view of a target. FIG. 3 is a cross-sectional view showing a structure of a magnetron sputtering cathode.

As shown in FIG. 1, a magnetron sputtering cathode 40 includes, as main components, a target 10 in the form of a disc, a backing plate 3 for attaching the target 10, a first magnet (for example, S-pole) 5 in the form of a cylinder provided so as to be located in the center part of the backside of the target, and a second annular magnet (for example, N-pole) 6 provided so as to be located on the peripheral part of the backside of the target and having a polarity different from that of the first magnet 5. That is, the target 10 has a region 10c to face the first magnet 5 in its center part, and an annular region 10d being apart radially from the above-mentioned center part by a predetermined distance and facing the second magnet. Because of this, when the target 10 is disposed on a cathode, the region 10c is located above the first magnet 5 and the region 10d is located above the second magnet 6 as a result.

The first magnet 5 has a cylindrical shape and the second magnet is disposed annually so as to surround the first magnet 5 with a space 30 in between. The first magnet 5 and the second magnet 6 are required only to have different polarities and are set so that when one of the magnets is set to N-pole, then the other to S-pole. For example, when the first magnet 5 is set to S-pole and the second magnet 6 to N-pole, the magnetic field that originates in the second magnet 6 toward the first magnet 5 through a surface to be sputtered of a target is formed so as to be substantially parallel with the target surface. However, when a ferromagnetic material is used as a target, the magnetic field passes through inside of the target, and therefore, a magnetic field component substantially parallel to the target surface is not formed. Because of this, in the present invention, the shape of a target is characterized as will be described later.

The backing plate 3 is made of stainless or copper and bonded to the target 10 with indium. Further, the backing plate 3 fixes the first magnet 5 and the second magnet 6 on the opposite side of the target 10. The first magnet 5 and the second magnet 6 are fixed to a yoke 7 on the opposite side of the backing plate 3.

On a sputtering surface (first surface) 10a of the target 10 made of a ferromagnetic material, a first annular groove 12, a second annular groove 14 provided outside the first annular groove 12, and a first annular projection 13 provided between the first annular groove 12 and the second annular groove 14 are formed. Further, on the sputtering surface (first surface) 10a of the target 10, a circular projection 11 is formed inside (center side) the first annular groove 12 and an annular projection 15 is formed outside (periphery side) the second annular groove 14. The above-mentioned region 10c is included in the circular projection 11 and the above-mentioned region 10d is included in the annular projection 15.

On the other hand, on a non-sputtering surface (second surface) 10b of the target 10, a second annular projection 21 provided at least at the position of the second surface 10b facing the first annular groove 12, a third annular groove 22 provided at the position of the second surface 10b facing the first annular projection 13 outside the second annular projection 21, a third annular projection 23 provided at least at the position of the second surface 10b facing the second annular groove 14 outside the third annular groove 22, and a fourth annular groove 24 provided outside the third annular projection 23 are formed. Further, on the non-sputtering surface (second surface) 10b of the target 10, a circular recess 20 provided at the position of the second surface in opposition to the circular projection 11, and a fourth annular projection 25 provided outside the fourth annular groove 24 are provided.

As described above, on the sputtering surface 10a, between the region 10c and the region 10d, the first annular groove 12, the second annular groove 14, and the first annular projection 13 are formed, and on the non-sputtering surface 10b, the third annular groove 22, the fourth annular groove 24, the second annular projection 21, the third annular projection 23, and the fourth annular projection 25 are formed.

As shown in FIG. 2, the first annular groove 12 and the second annular groove 14 formed on the target 10 are formed with an identical axis O as a center. A distance (MR1) between the center O and the center of the groove width of the first annular groove 12 and a distance (TR1) between the center O and the center of the projection width of the second annular projection 21, although not seen clearly in FIG. 2, are set so as to be the same. Similarly, a distance (MR2) between the center O and the center of the groove width of the second annular groove 14 and a distance (TR2) between the center O and the center of the projection width of the third annular projection 23, although not seen clearly in FIG. 2, are set so as to be the same.

Further, as shown in FIG. 3, depths D of the grooves of the first annular groove 12 and the second annular groove 14 are formed so as to be smaller than a groove width W thereof. Most preferably, the depths D of the grooves of the first annular groove 12 and the second annular groove 14 are 10 mm or less, respectively. Due to the above, a magnetic field is generated in the direction of the groove depth and it is possible to prevent the side wall of the groove from being sputtered excessively.

As shown in FIG. 3, a distance L between the second annular groove 14 and the fourth annular groove 24 (distance L between the outermost part of the bottom of the second annular groove 14 and the innermost part of the bottom of the fourth annular groove 24 in a predetermined radial direction from the center O) is set to 4 mm or less. This is because, if the distance is set to a value greater than this, it becomes difficult for the magnetic field from the second magnet 6 to get out to the target surface and it becomes difficult to obtain a sufficient of magnetic field component that is parallel to the target surface.

Figure 4:
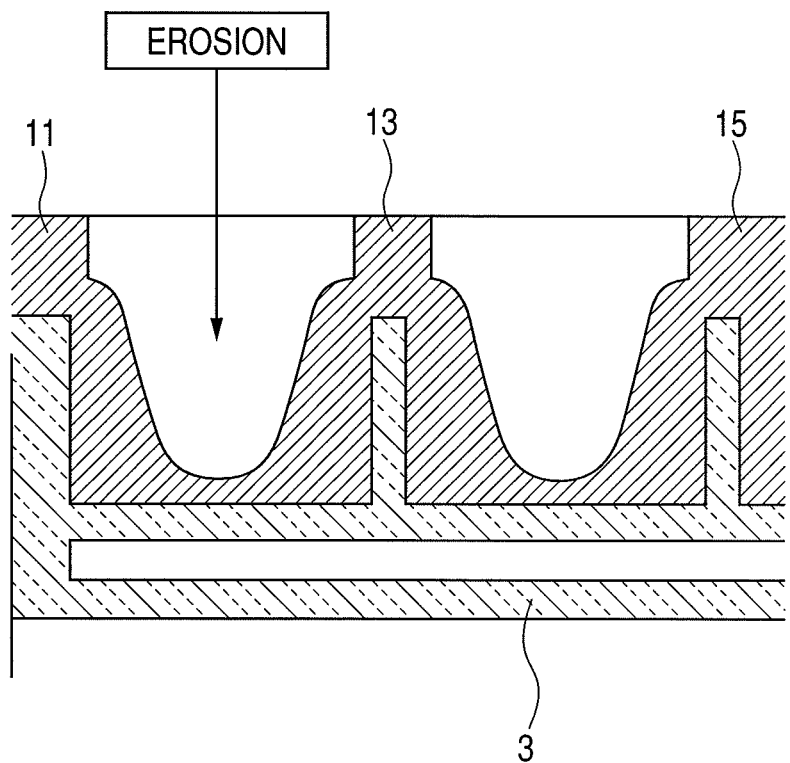
FIG. 4 is a diagram for illustrating erosion of a target according to an embodiment of the present invention.

Further, the projection width of the first annular projection 13 is set so as to be greater than the groove width of the third annular groove 22. Due to this, it is possible to form erosion patterns as shown in FIG. 4 and to improve the utilization efficiency of the target. If the projection width of the first annular projection 13 is made smaller than the groove width of the third annular groove 22, the erosion extends to the annular groove 22 easily and the backing plate of the side surface is made bare, and therefore, target replacement frequency is increased.

First Embodiment

The target 10 and the cathode 40 shown in FIG. 1, FIG. 2 and FIG. 3 described above are manufactured to the dimensions described below.
Target material alloy of iron and cobalt
Diameter of target 10 164 mm
Width×depth of first annular groove 12
16 mm×4 mm
Width×depth of second annular groove 13
16 mm×4 mm
Width×height of second annular projection 21
10 mm×10 mm
Width×height of second annular projection 23
10 mm×10 mm
MR1=TR1 36 mm
MR2=TR2 54 mm Distance L between second annular groove 14 and fourth annular groove 24
2 mm
Thickness T of target 10 16 mm
Height MT of magnets 5, 6 30 mm
Magnet material neodymium-iron-boron alloy (48 MGOe)

Figure 5:
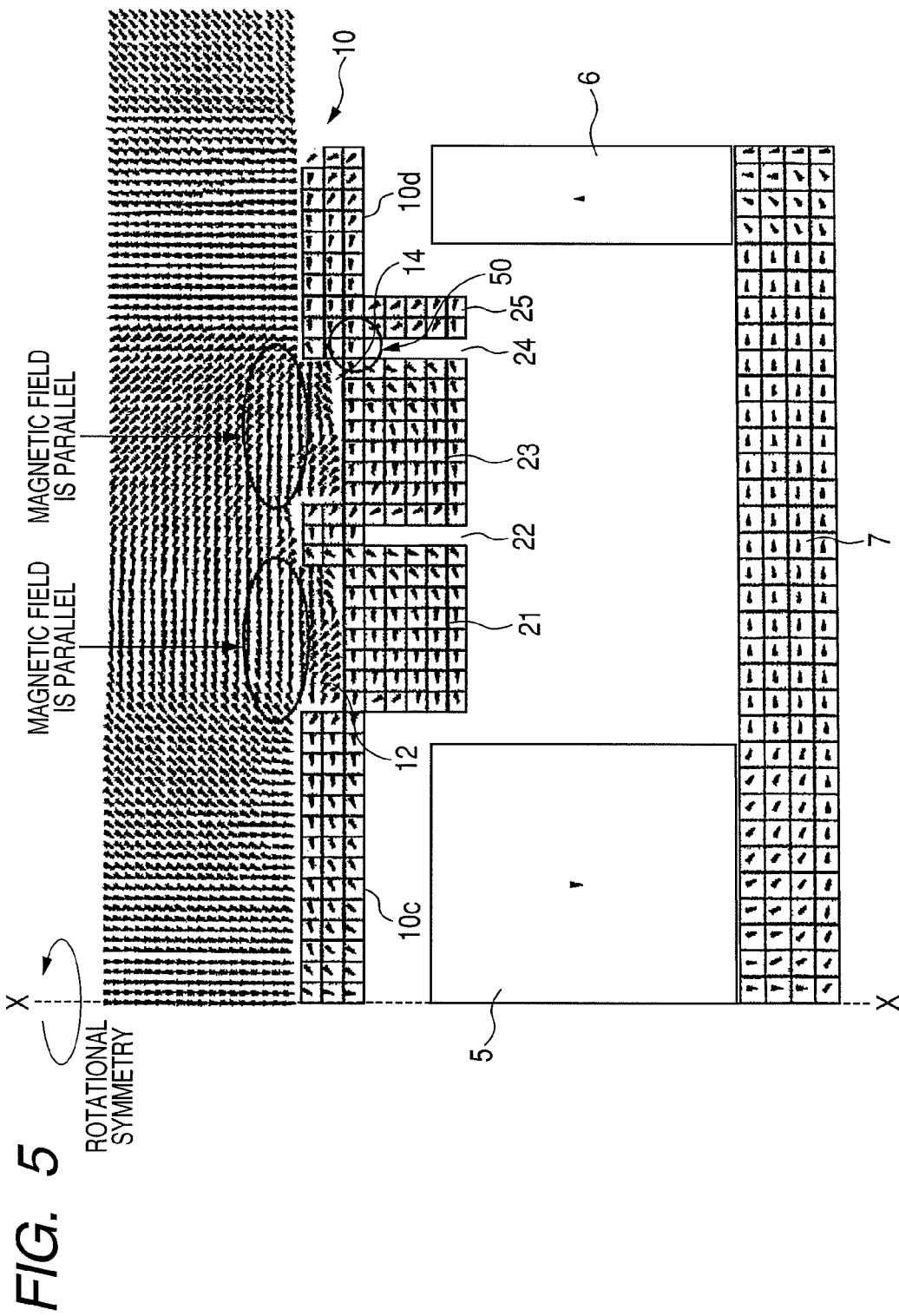
FIG. 5 is a diagram showing the result of a simulation of the target and cathode shown in FIG. 1 by the integral element method.

In order to visually explain that a horizontal magnetic field is generated on the target by applying the present invention, the result of a simulation by modeling the target and cathode manufactured as described above and using the integral element method is shown in FIG. 5. In FIG. 5, for the sake of simplification, only the half side with respect to the axis of the section view along the X-X axis is shown. If the target and cathode shown in FIGS. 1 to 3 are used, the shape of magnetic lines of force is as shown in FIG. 5 and it has been confirmed that sufficient of magnetic field component parallel to the bottom are formed in the groove (on the first annular groove 12 and on the second annular groove 14) from the present embodiment. Further, it has been confirmed that a magnetic flux density of 500 gauss or more can be obtained for both annular grooves, which is necessary for discharge.

As described above, in the present embodiment, between the region 10c facing the first magnet 5 and the region 10d facing the second magnet 6 of the target 10, the fourth annular projection 25 and the fourth annular groove 24 on the opposite side (on the side of the first magnet 5) of the second magnet 6 of the fourth annular projection 25 are formed so as to be in close proximity to one of the magnets (the second magnet in FIG. 5). Thus, the magnetic lines of force generated by the second magnet 6 are concentrated into the fourth annular projection 25 of the target 10, which is a magnetic body. However, the fourth annular groove 24 is formed inside (on the side of the first magnet 5) the fourth annular projection 25, and therefore, the magnetic body constituting the target 10 is discontinuous at the part of the above-described fourth annular groove 24. Because of this, most of the magnetic lines of force that have entered from the fourth annular projection 25 concentrate in a region 50 of the target 10. The maximum number (referred to as "number of saturated magnetic lines of force") of magnetic lines of force that pass in unit volume (unit area) of the magnetic body is fixed, and therefore, if the number of magnetic lines of force that enter the above-described region 50 is greater than the number of above-described saturated magnetic lines of force, the magnetic lines of force will leak out from the target 10 as a result. By the magnetic lines of force that have leaked out to the side of the sputtering surface 10a of the magnetic lines of force that have leaked out, a magnetic field parallel to the sputtering surface 10a is formed.

That is, when the fourth annular groove 24 is not formed, the magnetic lines of force that have entered the target 10 from the fourth annular projection 25 do not concentrate locally in the magnetic body but are formed in the magnetic body because the magnetic body constituting the target is not discontinuous. Because of this, when the target is thick, it is difficult to cause the magnetic lines of force to leak out from the sputtering surface 10a. However, in the present embodiment, the fourth annular groove 24 is formed inside (on the side of the first magnet 5) the fourth annular projection 25 having a structure that sucks in the magnetic lines of force and a discontinuous structure is formed in the magnetic body constituting the target 10, and thus the magnetic lines of force are caused to concentrate locally within the target. By causing the magnetic lines of force to concentrate locally, it is possible to cause the magnetic lines of force to leak out to the side of the sputtering surface 10a even if the third annular projection 23, which is a region in relation to sputtering, is thick. As shown in FIG. 4, because the erosion is formed in the second annular projection 21 and the third annular projection 23, it is possible to lengthen the target lifetime by making them thicker. That is, by making thicker the second annular projection 21 and the third annular projection 23, the effective thickness of the target 10 with its lifetime being taken into consideration is increased. Because of this, in the present embodiment, it is possible to generate a magnetic field sufficient to form a magnetic tunnel necessary for discharge on the sputtering surface 10a even if the thickness of the target 10 is effectively increased.

In the present embodiment, the second annular groove 14 is formed on the surface of the sputtering surface 10a, which faces the third annular projection 23, and therefore, it is possible to further narrow the region 50 and thereby to further increase the action of the local concentration of magnetic lines of force on the region 50.

Further, as described above, in the present embodiment, the configuration is such that the magnetic lines of force that have entered from a large region (the fourth annular projection 25) are guided into a narrow region (the region 50) by forming the fourth annular projection 25 and the fourth annular groove 24. Because of this, regardless of the magnetic material of the target, it is possible to guide the magnetic lines of force that exceed the number of saturated magnetic lines of force of the region 50 of the target 10 into the region 50, and therefore, it is possible to cause the magnetic lines of force to leak out of the above-mentioned region 50 even if the target 10 is configured by a ferromagnetic body. Because of this, even if a ferromagnetic body having large magnetic permeability and saturation flux density is used as a target, it is possible to concentrate the magnetic lines of force exceeding the number of saturated magnetic lines of force of the above-mentioned ferromagnetic body on the region 50 by adjusting the size of the fourth annular projection 25, the depth of the fourth annular groove 24, etc. Consequently, it is possible to generate a leakage magnetic field sufficient to form a magnetic tunnel necessary for discharge on the sputtering surface 10a even when using a ferromagnetic body as a target.

Typically, the distance (length) in which parallel magnetic lines of force are formed is limited. Consequently, for example, when the part of the target 10 between the fourth annular groove 24 and the first magnet 5 is long, there may be a case where a region not parallel with the sputtering surface 10a is formed in a magnetic field formed by the fourth annular groove 24 and the fourth annular projection 25. Because of this, preferably, as in the present embodiment, the third annular groove 22 is formed inside (on the side of the first magnet 5) the fourth annular groove 24 apart therefrom by a predetermined distance so that the third annular projection 23 is formed. In this manner, by forming the third annular groove 22 to locally concentrate the magnetic lines of force again, it is possible to form a leakage magnetic field and to form a magnetic field parallel with the sputtering surface 10a in a manner similar to that described above.

As described above, what is important in the present invention is that a structure to locally concentrate magnetic lines of force in a target is provided on the surface of the target, facing the magnets. Because of this, in the present embodiment, a target region configured to let magnetic lines of force pass in a wide region and a target region configured to let magnetic lines of force pass in a narrow region are formed, and in order to form the configuration, the fourth annular projection 25 and the fourth annular groove 24 are provided. That is, by providing the fourth annular groove 24 on the non-sputtering surface 10b of the target 10, the region 50 through which magnetic lines of force pass in a narrow region and the fourth annular projection 25 through which magnetic lines of force pass in a wide region are formed as a result, and therefore, the local concentration of magnetic lines of force as described above is realized.

Further, in the present embodiment, only by forming the fourth annular groove 24 on one of surfaces of a thick target using a normal groove forming method, it is possible to form the third annular projection 23 that is thick and the fourth annular projection 25 capable of letting magnetic lines of force pass in a wide region. Because of this, it is possible to increase the effective thickness of a target that has taken into consideration its lifetime and to realize the local concentration of magnetic lines of force by a simple method.

The essence of the present embodiment is that a structure to locally concentrate magnetic lines of force in a target on the surface of the target, facing a magnet, is provided, and therefore, it is not required to provide a structure to locally concentrate magnetic lines of force again (for example, the third annular groove 23) (refer to the second embodiment). Further, when an additional structure to locally concentrate magnetic lines of force is provided, the number of structures is not limited to one but two or more structures can be provided.

Here, a method of manufacturing the target 10 according to the present embodiment will be described.

In the present embodiment, the sputtering surface 10a of the target 10, which is a flat plate, is machined by a cutter etc. and thus the first annular groove 12 is formed so that the cylindrical projection 11 is formed, and then the second annular groove 14 is formed apart from the first annular groove 12. Due to the formation of these grooves, the part left between the first annular groove 12 and the second annular groove 14 is the first annular projection 13 and the part left on the periphery of the second annular groove 14 is the annular projection 15.

Next, on the non-sputtering surface 10b of the target 10, by forming a cylindrical recess by machining at a position facing the cylindrical projection 11, the region 10c is formed. Next, on the non-sputtering surface 10b, the third annular groove 22 is formed by machining at a position facing the first annular projection 13. Due to this, the left part is the second annular projection 21. Next, on the non-sputtering surface 10b, the fourth annular groove 24 is formed by machining in a region separate from the third annular groove 22 and facing the annular projection 15. Due to this, the left part is the third annular projection 23. Preferably, the fourth annular groove 24 is formed so that the outer wall surface of the third annular projection 23 and the outer wall surface of the second annular groove 14 coincide with each other. By forming so, it is possible to make the region 50 as narrow as possible. Next, on the non-sputtering surface 10b, by forming a groove by machining apart from the fourth annular groove 24, the region 10d is formed. Due to this, the left part is the fourth annular projection 25.

Second Embodiment

Figure 6:
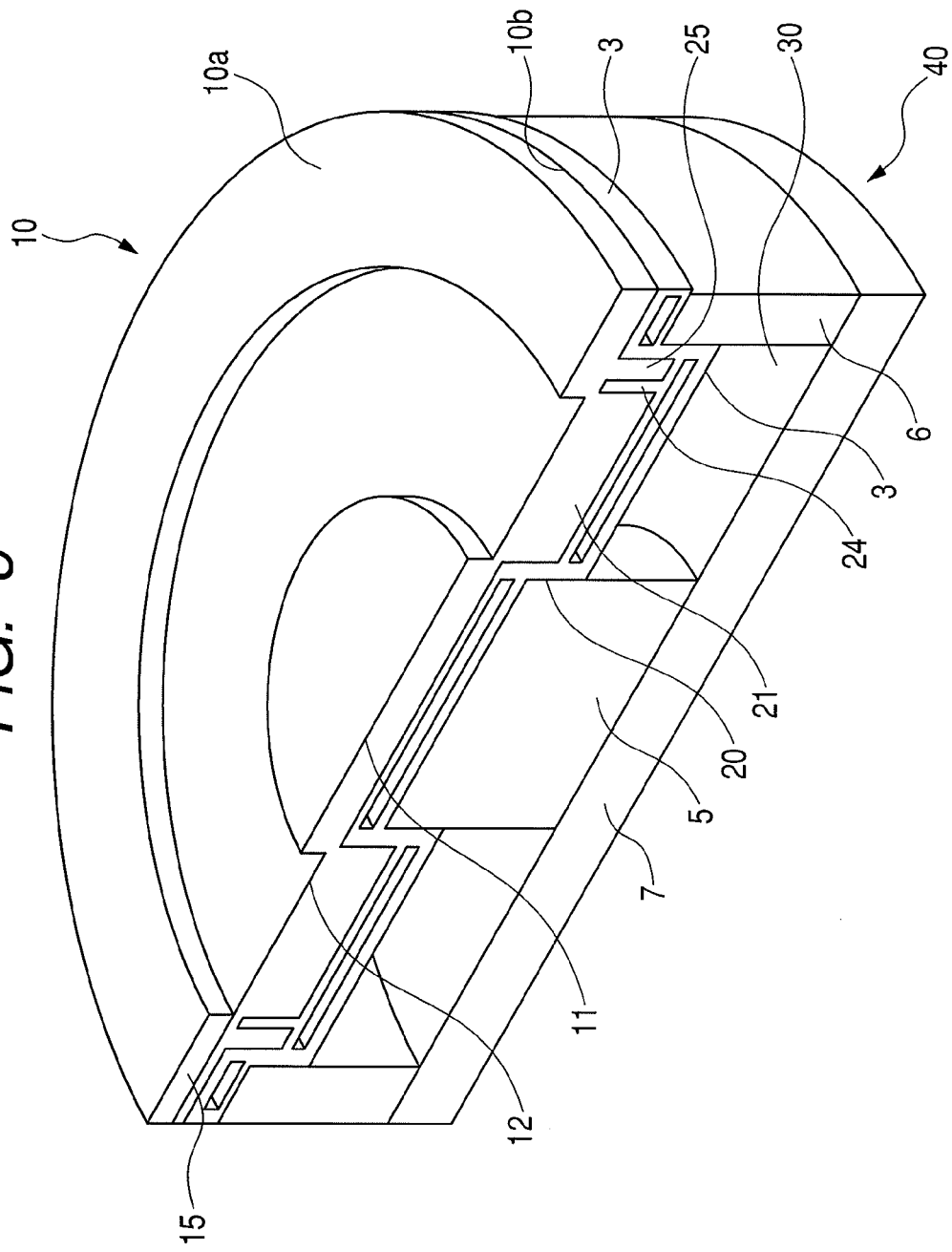
FIG. 6 is a diagram for illustrating a sputtering cathode according to an embodiment of the present invention.
Figure 7:
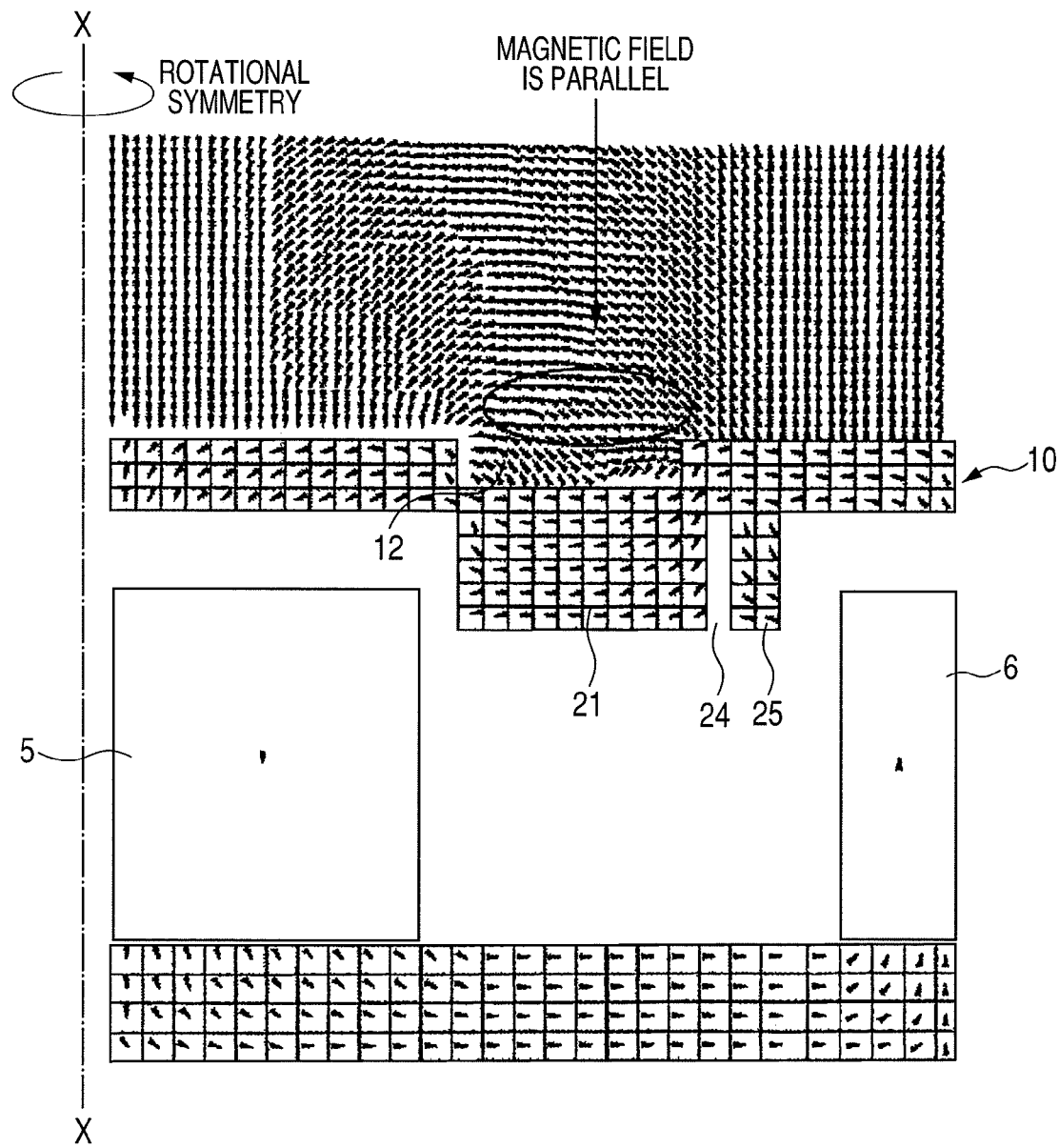
FIG. 7 is a diagram showing the result of a simulation of the target and cathode shown in FIG. 6 by the integral element method.

FIG. 6 is a diagram for illustrating a second embodiment of a magnetron sputtering cathode. FIG. 7 is a diagram for illustrating the result of a simulation of the target and cathode shown in FIG. 6 by the integral element method. In FIG. 7, for the sake of simplification, only the half side with respect to the axis of the section view along the axis X-X is displayed.

Unlike the target shown in FIG. 1, the target in the present embodiment has one annular groove formed on the sputtering surface of the target and one annular projection formed on the non-sputtering surface (the surface facing the sputtering surface of the target) of the target. That is, in the present embodiment, the target 10 includes the first annular groove 12 formed on the sputtering surface 10a of the target 10, the fourth annular groove 24 formed outside the first annular groove 12 on the non-sputtering surface 10b of the target 10, and the fourth annular projection 25 formed outside the fourth annular groove 24 on the non-sputtering surface 10b.

When the diameter of a target is 140 mm or less, it has been confirmed that magnetic lines of force substantially parallel to the bottom surface are formed in the groove part as shown in FIG. 7 even if only one groove is formed.

Third Embodiment

Figure 8:
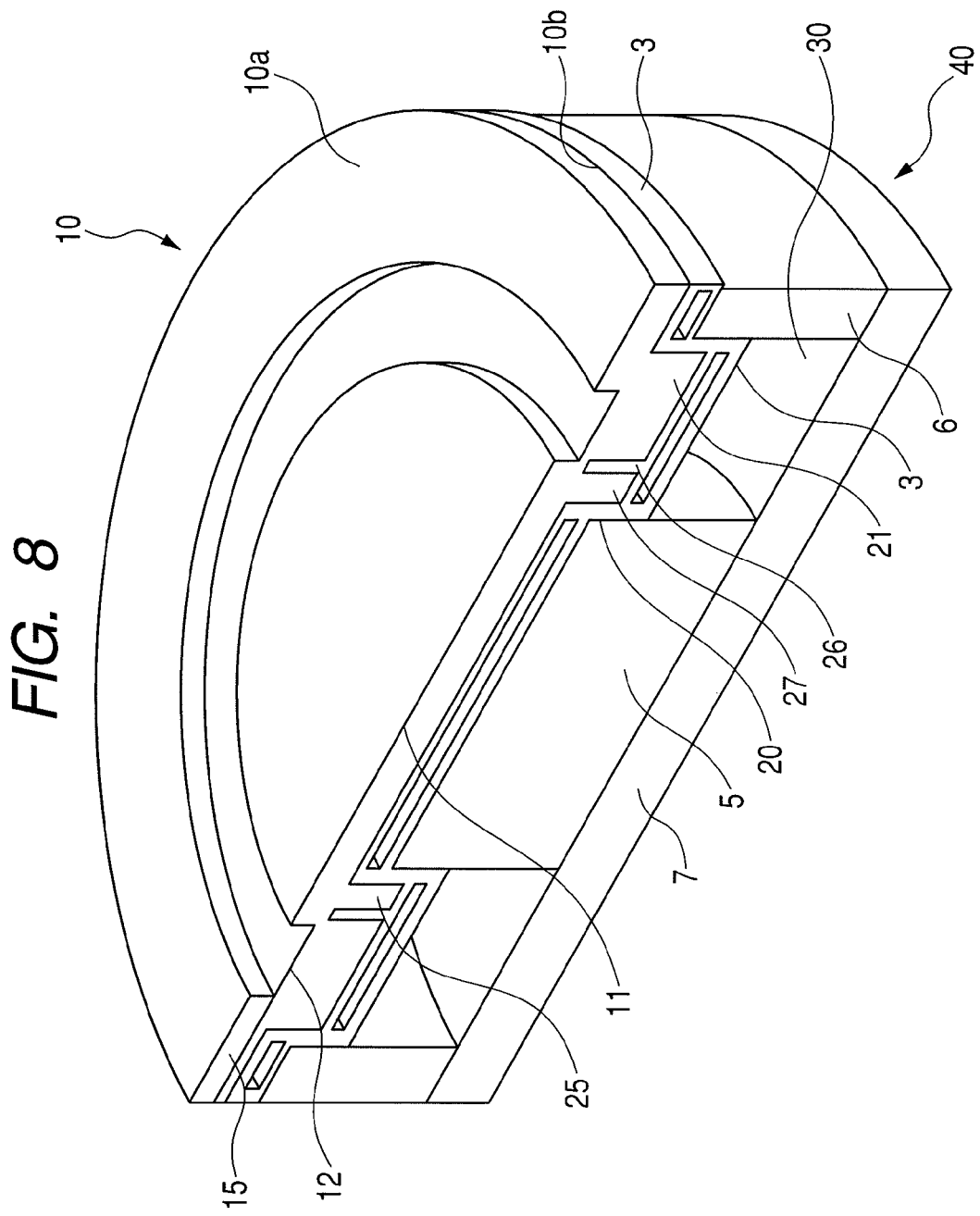
FIG. 8 is a diagram for illustrating a sputtering cathode according to an embodiment of the present invention.
Figure 9:
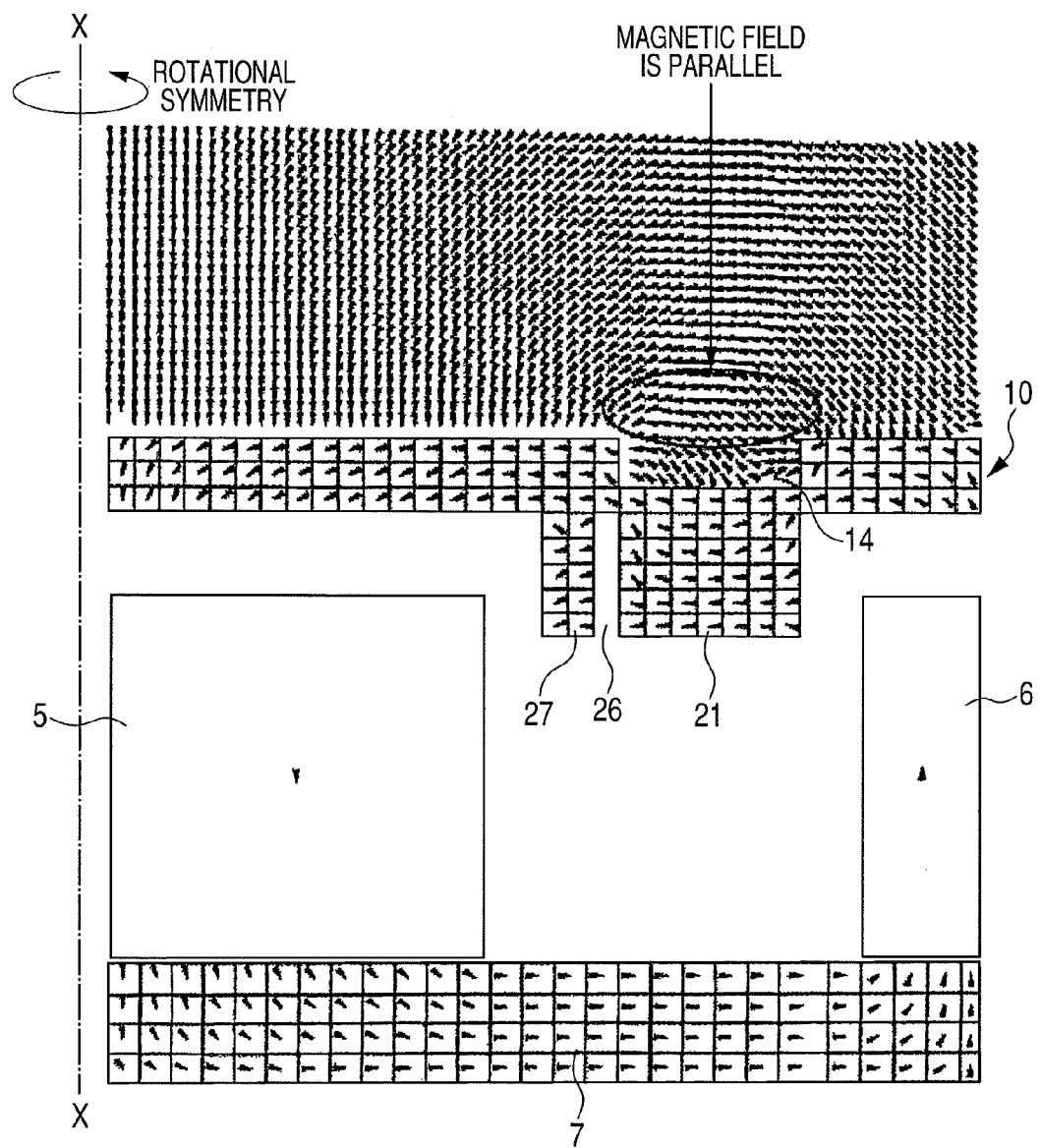
FIG. 9 is a diagram showing the result of a simulation of the target and cathode shown in FIG. 8 by the integral element method.

FIG. 8 is a diagram for illustrating a third embodiment of a sputtering cathode. FIG. 9 is a diagram for illustrating the result of a simulation of the target and cathode shown in FIG. 8 by the integral element method. In FIG. 9, for the sake of simplification, only the half side with respect to the axis of the section view along the axis X-X is displayed. In the present embodiment, unlike the target shown in FIG. 1, an inner annular groove 26 and an inner annular projection 27 are formed on the non-sputtering surface 10b on the side of the first magnet 5 located on the inner side of the target.

It has been confirmed that magnetic lines of force substantially parallel with the bottom surface are formed in the groove as shown in FIG. 9 even if the annular projection is formed inside the target.

Fourth Embodiment

Figure 10:
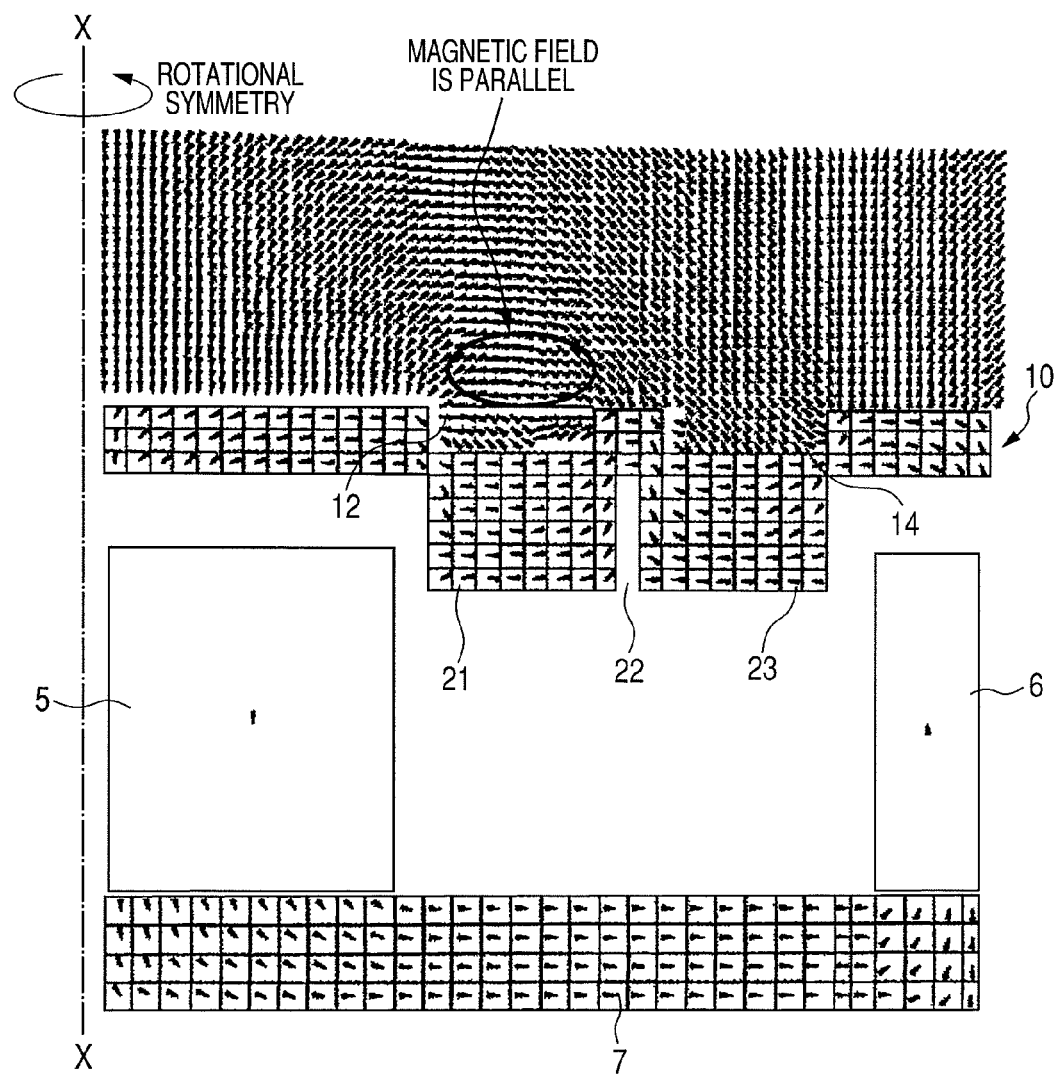
FIG. 10 is a diagram showing the result of a simulation of a target and a cathode according to an embodiment of the present invention by the integral element method.

FIG. 10 is a diagram for illustrating the result of a simulation of the target and cathode in the present embodiment by the integral element method. In FIG. 10, for the sake of simplification, only the half side with respect to the axis of the section view along the axis X-X is displayed. Unlike the target shown in FIG. 1, the fourth annular projection 25 is not formed in the target in the present embodiment. When the fourth annular projection 25 is not formed in the target as in the present embodiment, there exists a region in which magnetic lines of force substantially parallel to the bottom surface cannot be not formed in the groove part as shown in FIG. 10, however, because of the third annular groove 22, magnetic lines of force can be concentrated locally to the target 10, and therefore, it is possible to form a region in which magnetic lines of force substantially parallel to the bottom surface are formed in the groove part.

That is, by increasing the thickness of the second annular projection 21 in which erosion occurs and sputtering is performed, it is possible to form a magnetic field parallel to the sputtering surface 10a on the annular projection 21 even if the effective thickness of the target is increased or a ferromagnetic body is used as a target material.

Fifth Embodiment

Figure 11:
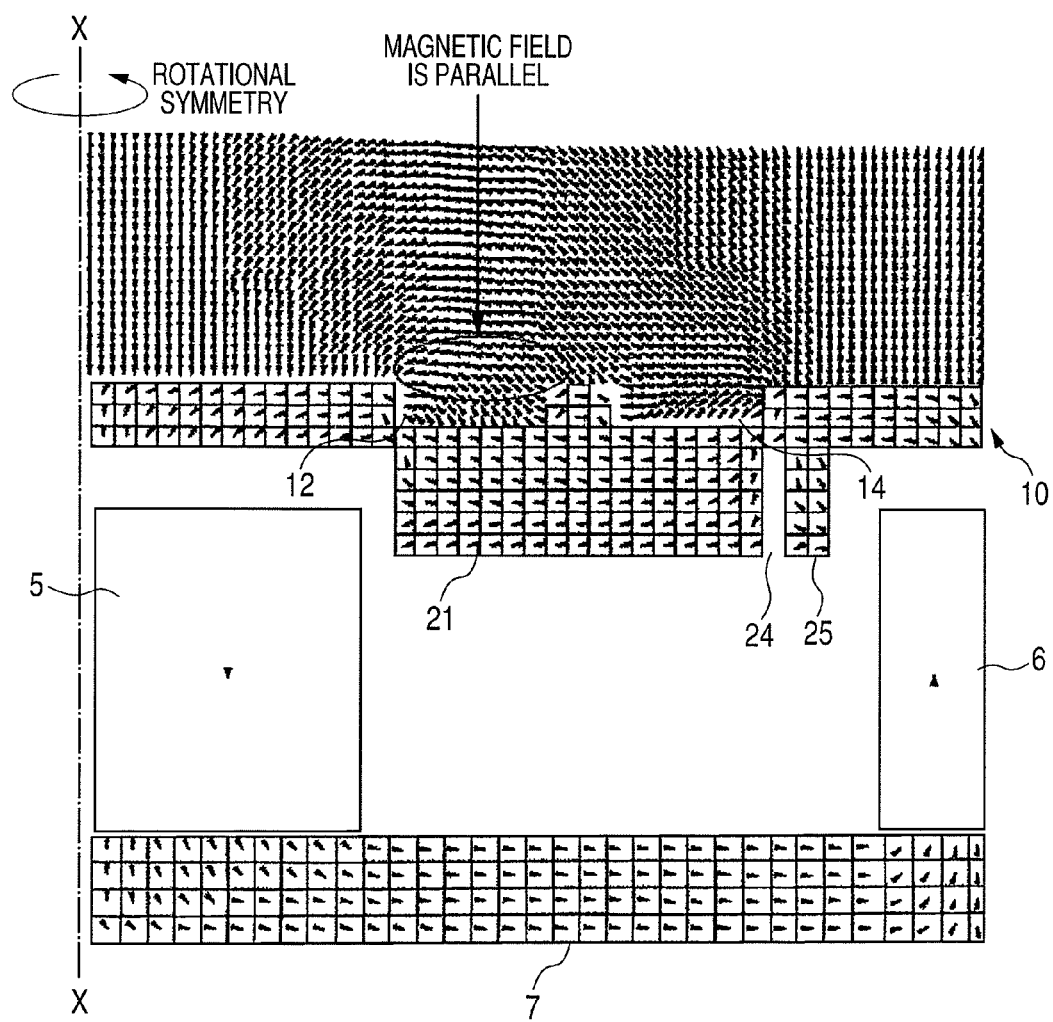
FIG. 11 is a diagram showing the result of a simulation of a target and a cathode according to an embodiment of the present invention by the integral element method.

FIG. 11 is a diagram for illustrating the result of a simulation of the target and cathode in the present embodiment by the integral element method. In FIG. 11, for the sake of simplification, only the half side with respect to the axis of the section view along the axis X-X is displayed. Unlike the target shown in FIG. 1, the third annular groove 22 is not formed in the target in the present embodiment. When the third annular groove 22 is not formed in the target as in the present embodiment, there exists a region in which magnetic lines of force substantially parallel to the bottom surface cannot be formed in the groove part as shown in FIG. 11, however, it is also possible to form a region in which magnetic lines of force substantially parallel to the bottom surface are formed in the groove.

Sixth Embodiment

Figure 12:
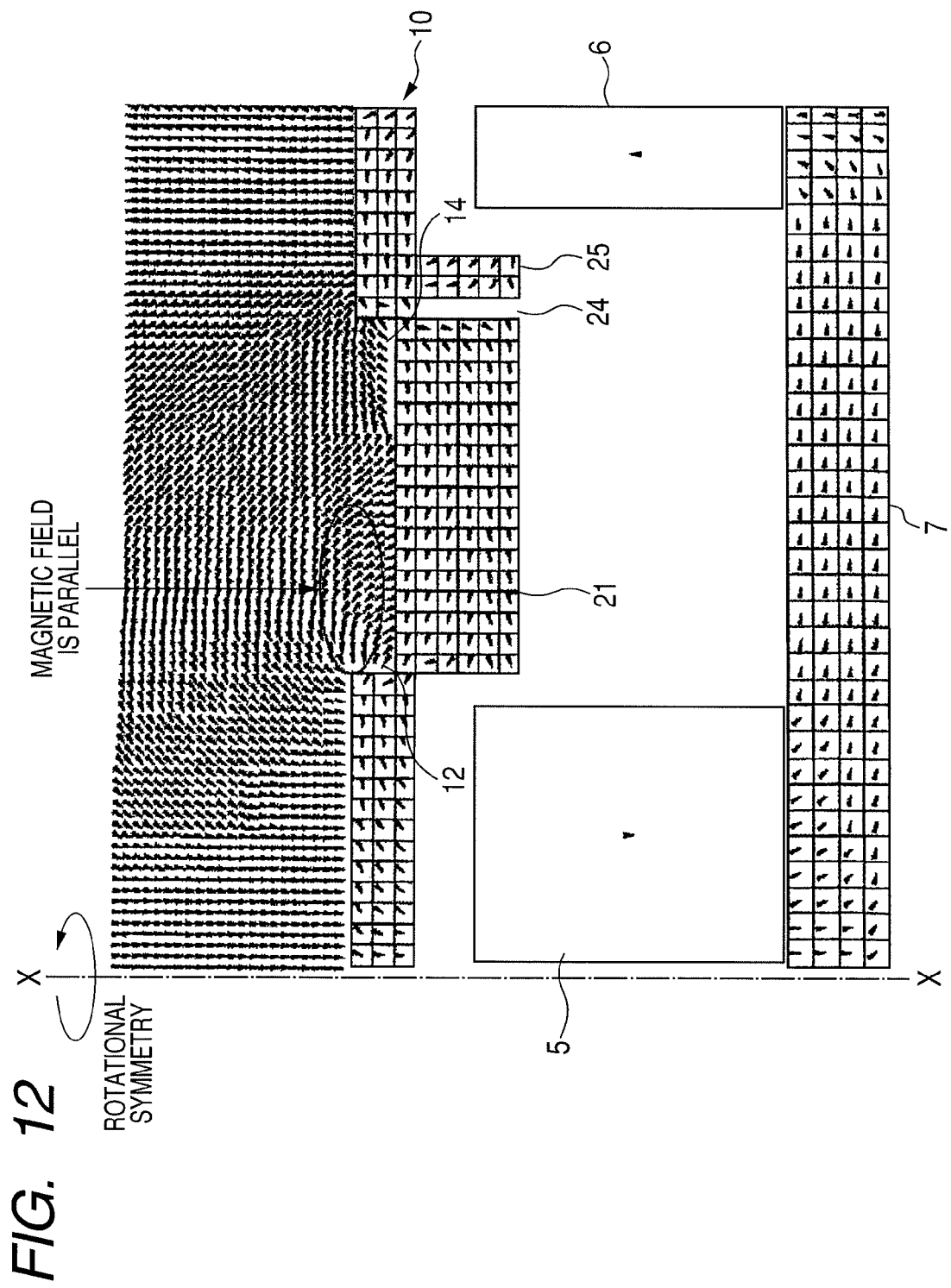
FIG. 12 is a diagram showing the result of a simulation of a target and a cathode according to an embodiment of the present invention by the integral element method.

FIG. 12 is a diagram for illustrating the result of a simulation of the target and cathode in the present embodiment by the integral element method. In FIG. 12, for the sake of simplification, only the half side with respect to the axis of the section view along the axis X-X is displayed. The basic configuration of the present embodiment is the same as that of the second embodiment shown in FIG. 6 and FIG. 7, however, differs from the latter in that the diameter of the target is set to 140 mm or more. As in the present embodiment, the diameter of the target is set to 140 mm or more, only one annular groove is formed on the sputtering surface of the target, and only one annular projection is formed on the non-sputtering surface of the target, there exists a region in which magnetic lines of force substantially parallel with the bottom surface cannot be formed in the groove part as shown in FIG. 12, however, it is also possible to form a region in which magnetic lines of force substantially parallel to the bottom surface are formed in the groove.

Figure 13:
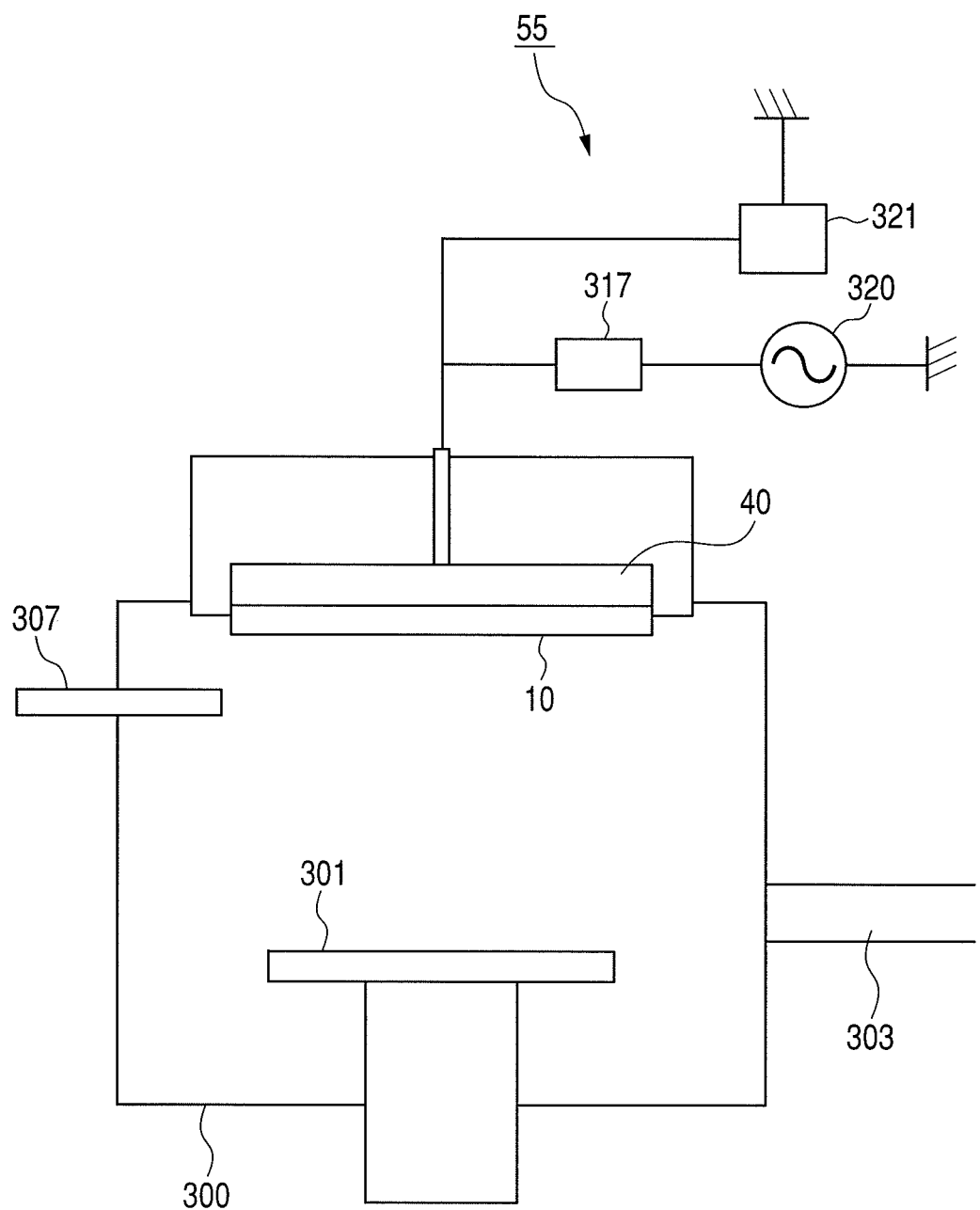
FIG. 13 is a diagram for illustrating a sputtering apparatus including a magnetron sputtering cathode according to an embodiment of the present invention.

A sputtering apparatus including the magnetron sputtering cathode according to the present invention will be described with reference to FIG. 13.

A sputtering apparatus 55 includes a processing chamber 300 connected with an exhaust system 303, the cathode 40 for placing the target 10 made of a ferromagnetic material provided in the processing chamber 300, a gas introduction means 307 for introducing a process gas, such as an inert gas (for example, Argon), into the processing chamber 300, and a substrate holder 301 provided in the processing chamber 300. To the cathode 40, a high frequency power source 320 is connected via a DC power source 321 and a matching circuit 317. The magnetron sputtering cathode according to the present invention is used in the condition that a target having an erosion surface disposed so as to face the wafer supported by the non-rotational supporting means. The sputtering apparatus 55 is used mainly to manufacture a magnetic device, such as MRAM having a TMR element and a magnetic head or magnetic sensor having a GMR element or TMR element.

As a target material that can be applied to the present invention, mention is made of an iron-cobalt alloy, a nickel-iron alloy, etc.

What is claimed is:
1. A magnetron sputtering cathode comprising:
    a target having:
        a first annular groove provided on a first surface of the target;
        a first annular projection provided at a position facing the first annular groove on a second surface of the target on the opposite side of the first surface and having an inside side wall facing to the inside of the target and an outside side wall facing to the outside of the target;
        a second annular groove provided at least on one of sides outside and inside the first annular projection on the second surface; and
        a second annular projection provided at least on one of sides outside and inside the second annular groove on the second surface and having an inside side wall facing to the inside of the target and an outside side wall facing to the outside of the target;

a first magnet located inside the first annular groove of the target on the side of the second surface of the target; and a second magnet having a polarity different from that of the first magnet and located outside the first annular groove of the target on the side of the second surface of the target, wherein the inside side wall and the outside side wall of the first annular projection, and the inside side wall and the outside side wall of the second annular projection are located between the first magnet and the second magnet, and a top surface at the first annular projection is directly opposite through the target to a bottom surface at the first annular groove.

2. A magnetron sputtering cathode according to claim 1, wherein a backing plate is provided between the target and the first magnet and the second magnet.

3. A magnetron sputtering cathode according to claim 1, wherein the distance between the first annular groove and the second annular groove is 4 mm or less.

4. A magnetron sputtering cathode according to claim 1, wherein the depth of the first annular groove is less than the groove width of the first annular groove.

5. A target configured to be provided on a cathode including a first magnet and a second magnet disposed so as to surround the first magnet and having a polarity different from that of the first magnet, the target comprising:

a first region to face the first magnet;

a second region to face the second magnet;

a first annular groove provided on a first surface of the target;

a first annular projection provided at a position facing the first annular groove on a second surface of the target on the opposite side of the first surface and having an inside side wall facing to the inside of the target and an outside side wall facing to the outside of the target;

a second annular groove provided at least on one of sides outside and inside the first annular projection on the second surface; and a second annular projection provided at least on one of sides outside and inside the second annular groove on the second surface and having an inside side wall facing to the inside of the target and an outside side wall facing to the outside of the target, wherein the inside side wall and the outside side wall of the first annular projection, and the inside side wall and the outside side wall of the second annular projection are located between the first region and the second region, and a top surface at the first annular projection is directly opposite through the target to a bottom surface at the first annular groove.

6. A magnetron sputtering apparatus comprising:
a magnetron sputtering cathode according to claim 1;
an exhaust means; and
a gas introduction means for introducing a process gas.

7. A magnetron sputtering apparatus according to claim 6, wherein a backing plate is provided between the target and the first magnet and the second magnet.

8. A method for manufacturing a magnetic device using a magnetron sputtering apparatus according to claim 6.

9. A magnetron sputtering cathode according to claim 1, wherein the target is a magnetic body.

10. A target according to claim 5, wherein the target is a magnetic body.

11. A magnetron sputtering apparatus according to claim 6, wherein the target is a magnetic body.

12. A magnetron sputtering cathode according to claim 1, wherein the width of the top surface at the first annular projection is wider than the bottom surface at the first annular groove.

13. A magnetron sputtering cathode according to claim 1, wherein the target further comprises:

a third annular projection provided on one of sides outside and inside the first annular groove on the first surface; and a third annular groove provided on one of sides outside and inside the third annular projection on the first surface, and wherein a top surface at the second annular projection is directly opposite through the target to a bottom surface at the third annular groove.

14. A magnetron sputtering cathode according to claim 1, wherein the target further comprises a circular projection provided at a center on the first surface, and wherein the first annular groove is provided outside the circular projection and a diameter of a top surface at the circular projection is wider than the width of the bottom surface at the first annular groove.

15. A magnetron sputtering cathode according to claim 1, wherein the target further comprises a third annular projection provided inside the first annular groove on the first surface, and wherein a top surface at the third annular projection is located inside the inside side wall of the first annular projection.

* * * * *